United States Patent
Lagache et al.

(10) Patent No.: US 10,216,873 B2
(45) Date of Patent: Feb. 26, 2019

(54) METHOD AND APPARATUS FOR DESIGN OF PIPELINE COMPONENTS

(71) Applicant: Acergy France SAS, Suresnes (FR)

(72) Inventors: Aurelien Lagache, Issy les Moulineaux (FR); Julien Simon, Colombes (FR); Anthony Pollet, Vincennes (FR)

(73) Assignee: Acergy France SAS, Suresnes (FR)

(*) Notice: Subject to any disclaimer, the term of this patent is extended or adjusted under 35 U.S.C. 154(b) by 740 days.

(21) Appl. No.: 14/397,163

(22) PCT Filed: Apr. 22, 2013

(86) PCT No.: PCT/IB2013/001151
§ 371 (c)(1),
(2) Date: Oct. 24, 2014

(87) PCT Pub. No.: WO2013/160771
PCT Pub. Date: Oct. 31, 2013

(65) Prior Publication Data
US 2015/0142396 A1 May 21, 2015

(30) Foreign Application Priority Data
Apr. 27, 2012 (GB) .................. 1207374.8

(51) Int. Cl.
*G06F 17/50* (2006.01)
(52) U.S. Cl.
CPC .................. *G06F 17/5018* (2013.01)
(58) Field of Classification Search
CPC .................. G06F 17/5018; G06F 17/5009
USPC .................................................. 703/2
See application file for complete search history.

(56) References Cited

U.S. PATENT DOCUMENTS

| | | | |
|---|---|---|---|
| 6,381,564 B1 | 4/2002 | Davis et al. | |
| 2009/0078425 A1* | 3/2009 | Wajnikonis | E21B 17/015 166/367 |
| 2009/0319453 A1* | 12/2009 | Goel | G06F 17/5009 706/13 |

FOREIGN PATENT DOCUMENTS

WO    WO 2005/001722    1/2005

OTHER PUBLICATIONS

Yong Bai and Qiang Bai, Subsea Pipelines and Risers, Elsevier Ltd., 2005, 83, 97, 105, 134-136, 140-141, 325, 409-410, 488, 532-545, & 735).*
Yue Wu et. al., Deterministic global optimization approach to steady-state distribution gas pipeline networks, Springer Science+ Business Media, LLC 2007, Optim Eng (2007) 8: 259-275.*

(Continued)

*Primary Examiner* — Aniss Chad
*Assistant Examiner* — Justin C Mikowski
(74) *Attorney, Agent, or Firm* — Levy & Grandinetti

(57) ABSTRACT

Methods and apparatus for pipeline component design are described. Input parameters and output parameters for the component design are identified. An analytic model is constructed using a design of experiments technique to represent influence of the input parameters on the output parameters. Value sets for the input parameters which meet a selection criterion for at least one of the output parameters are then identified. Finite element analysis is conducted on the identified value sets, and a pipeline component design choice is identified from results of the finite element analysis. Pipeline components are then manufactured according to the identified design.

10 Claims, 12 Drawing Sheets

(56) References Cited

OTHER PUBLICATIONS

Zoran S. Kapelan et. al., Multiobjective design of water distribution systems under uncertainty, Water Resources Research, vol. 41, W11407, doi:10.1029/2004WR003787, 2005.*
Weber, D.C. et al., "A First Course in the Design of Experiments: A Linear Models Approach," CRC Press (1999).
Myers, R.H. et al., "Response Surface Methodology: Process and Product Optimization Using Designed Experiments," Wiley (2002).

* cited by examiner

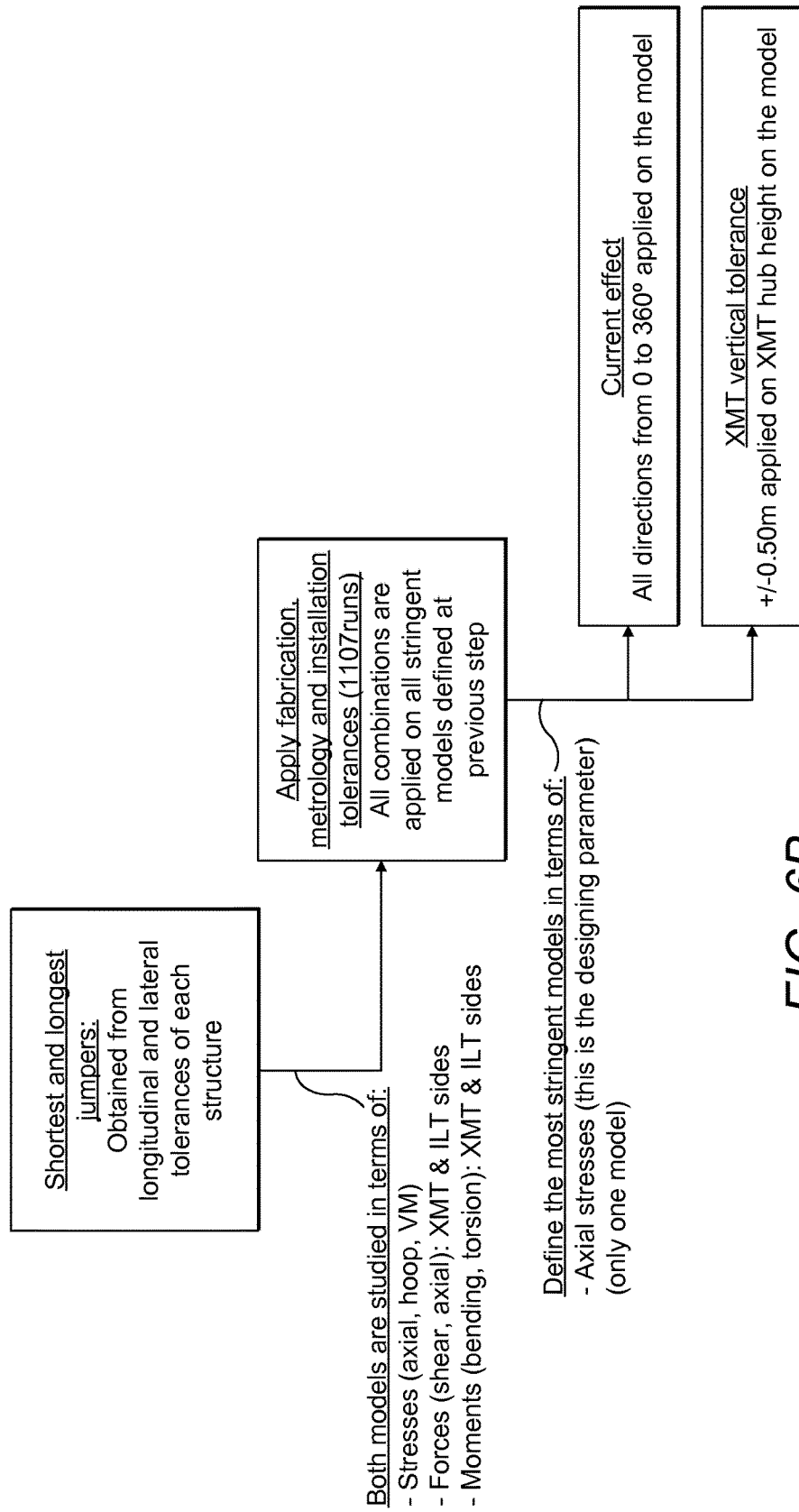

METHOD AND APPARATUS FOR DESIGN OF PIPELINE COMPONENTS

This Application is the U.S. National Phase of International Application Number PCT/IB2013/001151 filed on Apr. 22, 2013, which claims priority to GB 1207374.8 filed on Apr. 27, 2012.

FIELD OF INVENTION

The present invention relates to a method and apparatus for design of pipeline components. It is particularly applicable to design of tie-ins, such as jumpers and spoolpieces, for joining gaps in a piping system or for connection between components of different types.

BACKGROUND TO THE INVENTION

Jumpers and spoolpieces, known generally as "tie-ins", are pipeline components used to connect a pipeline, riser or piping structure to another pipeline, riser or piping structure. The term "jumper" is generally used for a vertical arrangement elevated from the seabed or another connection separate from the seabed, whereas "spoolpiece" or "spool" is generally used for an arrangement which is largely horizontal and in contact with the seabed.

Tie-ins such as jumpers and spoolpieces are part of a piping delivery system adapted to deliver fluids often under substantial pressure and at elevated temperature. They are required either to join gaps in a piping system required for geometrical layout reasons, or to act as protection when different structures are adjoined (for example, to prevent overload of manifold or riser structures by mitigating flowline expansion). Tie-ins will frequently be exposed to significant external forces, such as those created by currents. They may be used to join other pipeline components that have a fixed position or which are allowed to move.

A tie-in may be a section of rigid or flexible pipeline (rigid pipe and flexible pipe are both terms of art in offshore pipelaying, as set out in standards such as ISO 13628). A rigid spoolpiece or jumper is typically fabricated from welded steel pipe, whereas a flexible spoolpiece or jumper is typically fabricated from a continuous multi-layer flexible pipe construction.

Effective design of jumpers and spoolpieces is a complex task. When in place, pipelines will move due to temperature and pressure effects. Jumpers and spoolpieces must not only be able to withstand such expansion effects but also be effective to limit the transmission of these effects to other structures that they protect. A large deepwater field may require more than fifty jumpers and spoolpieces.

A conventional design approach will typically involve construction of a complex model of a component design which will then be tested for various output properties in a number of different use cases. The component design will be described in terms of a number of input parameters which are sampled across their range (for example, an input parameter representing a tolerance of between 1 and −1 may be sampled at 1, 0 and −1) to provide a reasonable expectation of exploring extreme stresses and loads on the component. Each of these input parameter value combinations for each use case may require a separate finite element analysis.

The design of these components is thus extremely time-consuming, typically requiring finite element analysis of a large number of cases to provide effective tolerance for misalignment. Spoolpiece and jumper design will frequently form a major part of the engineering design activity required on the pipeline design for such a project.

SUMMARY OF THE INVENTION

Accordingly, in one aspect the invention provides a method of pipeline component design comprising: identifying input parameters and output parameters for the component design; using a design of experiments technique to construct analytic models representing the influences of the input parameters on the output parameters; identifying value sets for the input parameters which meet one of one or more selection criteria for at least one of the output parameters, the selection criteria comprising minimising or maximising at least one of the output parameters; conducting finite element analysis on the identified value sets, and identifying a pipeline component design choice from results of the finite element analysis; wherein no convergence criteria are used in the design of experiments technique or the finite element analysis.

This approach greatly reduces the time taken in component design without affecting the accuracy of the results. In some cases accuracy may be increased, as a full computational solution may be achieved without use of an approximation taken to reduce the computation time to make the problem tractable under conventional methods. The avoidance of any need for convergence criteria reduces computational complexity and is found to lead to effective results for problems of this type, involving static loads.

Design of experiments methodologies have been used in other areas of engineering design. US 2009/0319453 describes a technique for populating a design of experiments algorithm by using genetic algorithms in computer aided engineering design. WO 2005/001722 describes a technique for improving design of aeroplane parts by using design of experiments techniques to support computational fluid dynamical calculations. Neither prior art document teaches the approach described above.

This approach is particularly effective for the design of tie-in components, such as jumpers and spoolpieces. It can be used to design jumpers and spoolpieces which meet operational requirements in a greatly reduced period of time.

Advantageously, the input parameters comprise one or more misalignment tolerances. These misalignment tolerances can be aggregated from physical tolerances such as fabrication, metrology and installation tolerances.

Preferably, the input parameters comprise one or more translational tolerances and one or more rotational tolerances.

In some embodiments, the input parameters comprise one or more soil property parameters. This is appropriate for the design of a spoolpiece, which will need to contact the seabed in use. This approach allows for misalignment tolerances and soil property parameters to be treated together, rather than in separate calculations as in conventional approaches.

Preferably, the analytic models comprise a quadratic model for each output parameter. In particular embodiments, the analytic model comprises only terms which are constant, first or second order terms and interaction terms. This provides an analytic model which in practice provides a good characterisation of the system while still being computationally tractable.

In embodiments, the design of experiments technique comprises a Box-Behnken technique, an Optimal Latin Hypercube technique or a 3-levels orthogonal array technique. These techniques are particularly suitable where a quadratic model is used.

In other embodiments, the design of experiments technique comprises use of a 2-levels orthogonal array technique without interaction between input parameters. This is a particularly suitable technique when the design problem can be presented as a group of non-interacting linear problems.

Preferably, identifying value sets for the input parameters which minimise or maximise at least one of the output parameters comprises iterating an optimization loop for each output parameter which minimises or maximises that output parameter. Advantageously, the optimization loop uses a differentiable optimization technique. This approach is particularly suitable where the analytic model is linear and quadratic only, so the resulting functions are concave or convex.

In a further aspect, the invention provides a method of manufacturing a pipeline component, comprising designing a pipeline component according to the method as set out above, and manufacturing the pipeline component in accordance with the identified pipeline component design.

In a still further aspect, the invention provides a pipeline component design system comprising a computing apparatus programmed to carry out the method of designing a pipeline component as set out above.

In a yet further aspect, the invention provides a signal comprising a data structure adapted to program a computing apparatus to carry out the method of designing a pipeline component as set out above.

In a still further aspect, the invention provides a pipeline component designed by the method or the design system as set out above—in particular, a tie-in designed by such a method or design system. In a further aspect, the invention provides a pipeline comprising one or more pipeline components designed by such an approach, particularly where the one or more pipeline components are tie-in components.

BRIEF DESCRIPTION OF THE DRAWINGS

Specific embodiments of the invention will now be described, by way of example, with reference to the accompanying drawings, in which:

FIG. 6A illustrates an exemplary 2-D jumper design and FIG. 6B illustrates a calculation sequence for use with such a 2-D jumper design;

DETAILED DESCRIPTION OF THE EMBODIMENTS

Figure 1:
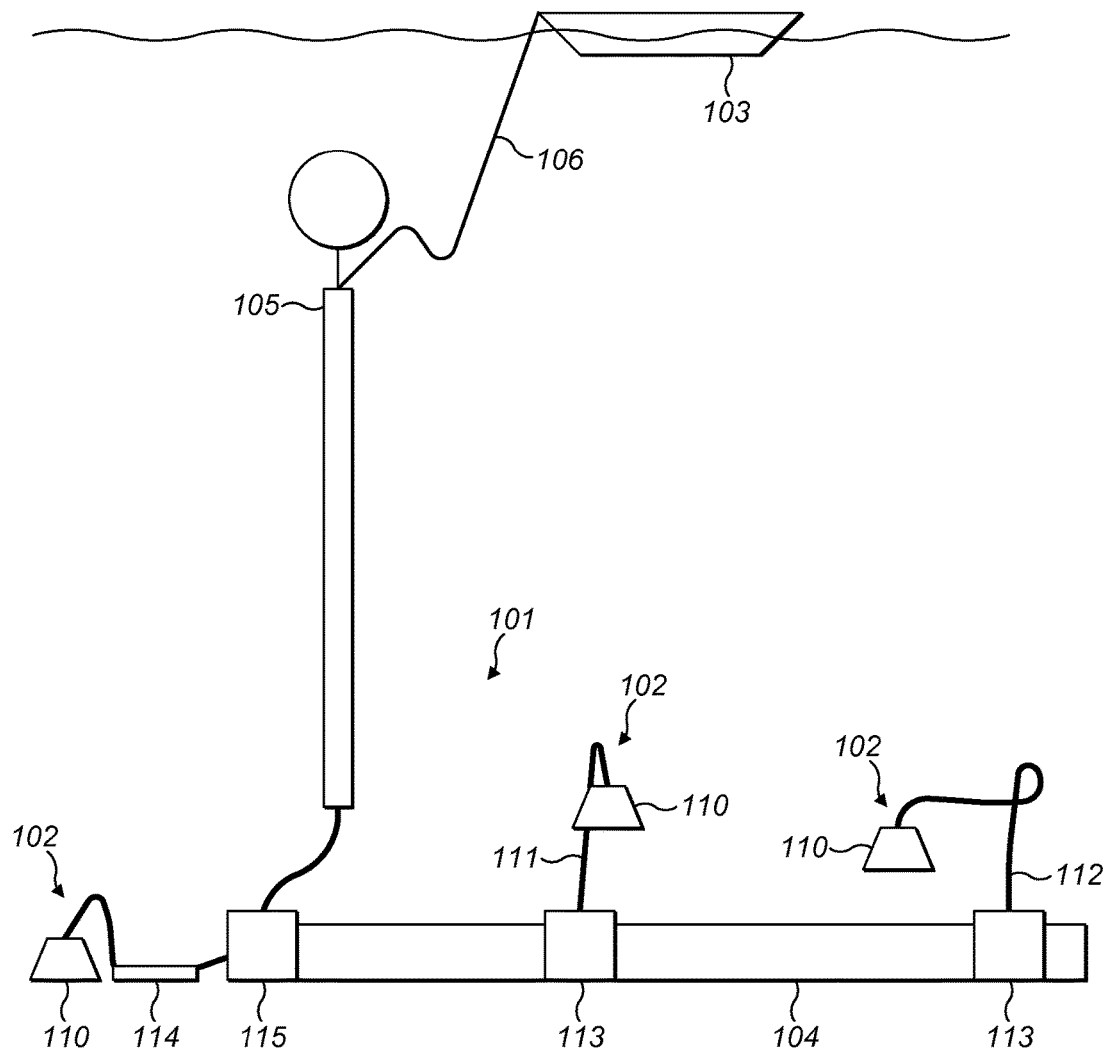
FIG. 1 is an illustration of an exemplary pipeline system including tie-in components such as jumpers and spoolpieces.

FIG. 1 illustrates a deepwater pipeline system comprising exemplary tie-in components. A pipeline 101 connects a plurality of wellheads 102 with a surface vessel 103. A laid pipeline 104 containing a number of joined pipeline segments is connected to a riser structure 105. The tie-in components of interest are in this case located within the pipeline 101 between the wellheads 102 and the riser structure 105—there may be flexible jumpers 106 connecting a top of the riser structure 105 with the surface vessel 103, but these are not a primary consideration for embodiments of the invention discussed below.

Each wellhead 102 in the arrangement shown is topped with a Christmas tree 110, which is a conventionally used structure for providing fluid paths from a well to a pipeline. First and second jumpers 111 and 112 are each shown connecting a Christmas tree 110 to an intermediate structure of the laid pipeline 104 known as an in-line tee 113. Jumpers 111 and 112 differ in that first jumper 111 is a 2-dimensional design in a single plane, whereas second jumper 112 is a 3-dimensional design extending beyond a single plane—different jumper designs may be required to match different pipeline geometries and requirements of a given location. Spoolpiece 114 is shown at the end of the laid pipeline 104, connecting a pipeline end termination (PLET) 115 to a further Christmas tree 110.

As has been previously discussed, the jumpers 111, 112 and spoolpiece 114 will in practice see significant variation in pressure and temperature conditions and will be required to meet significant tolerances. They will also need to be correctly adapted to other environmental conditions—for example, spoolpieces will be in engagement with the seabed and will experience associated stresses, and jumpers will experience forces from currents.

Embodiments of the invention provide methods and apparatus for design of pipeline components which are effective for design of tie-ins in systems such as that shown in FIG. 1. Basic elements of such a method are described below with reference to FIG. 2.

Figure 2:
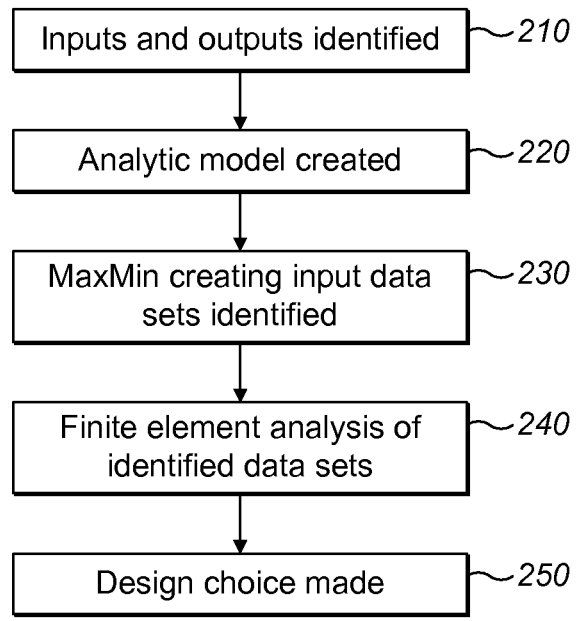
FIG. 2 illustrates schematically a method of designing a pipeline component in accordance with an embodiment of the invention.

FIG. 2 indicates schematically a method of pipeline component design according to an embodiment of the invention. First of all, a plurality of inputs and outputs of the design are identified (210). The inputs of the design are properties present or required in the design as variables. Of particular significance in tie-in design are component tolerances—both translational and rotational tolerances are significant, as will be discussed below. The outputs of the design are properties resulting from the design which may be optimised or otherwise designed to lie within design constraints by variation of inputs.

After this, a design of experiments methodology is used (220) to create analytic models representing the influences of the inputs on the outputs. As will be discussed further below, any of a number of different design of experiments methodologies may be used for this purpose.

Once the analytic model is constructed, sets of values of the inputs which minimise or maximise one or more of the outputs are identified (230). This identifies a limited number of component designs which require further analysis. A finite element analysis is carried out (240) on each of these identified designs to provide an efficient exploration of the design space for the component and to allow a design choice to be made (250).

Each of these steps will now be considered in more detail. Practical examples will then be discussed.

Inputs and Outputs

Figure 3:
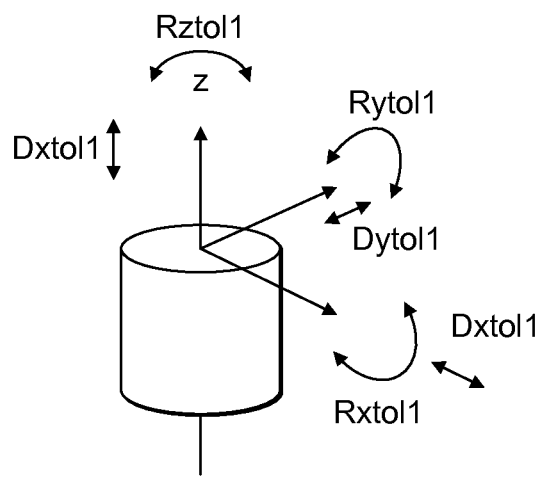
FIG. 3 illustrates input parameters in one embodiment of the invention.

The present inventors have appreciated that for the present purposes, many of the physical tolerances of the tie-in—such as fabrication, metrology and installation tolerances—may be considered together as "misalignment tolerance" applied at the extremities of the jumper or spool. This tolerance may be considered as a linear tolerance and a rotational tolerance in each axial direction, as shown in FIG. 3 (for a vertical connector) and as indicated in Table 1 below.

TABLE 1

Symbols of misalignment tolerance

| Extremity | 1 | 2 |
|---|---|---|
| Linear Tolerance in terms of X (mm) | DXtol1 | DXtol2 |
| Linear Tolerance in terms of Y (mm) | DYtol1 | DYtol2 |
| Linear Tolerance in terms of Z (mm) | DZtol1 | DZtol2 |
| Angular Tolerance in terms of X (°) | RXtol1 | RXtol2 |
| Angular Tolerance in terms of Y (°) | RYtol1 | RYtol2 |
| Angular Tolerance in terms of Z (°) | RZtol1 | RZtol2 |

For jumpers, it may not be necessary to consider other input parameters. It will be necessary to do so for spools, because spools contact the seabed. Consequently, input parameters representing soil conditions are also required for spools, as indicated in Table 2 below.

TABLE 2

Symbols of soil conditions

| | Symbol |
|---|---|
| Soil Stiffness (N/m/m) | K_soil |
| Lateral Friction Coefficient in Hydrotest | mu_lat_hyd |
| Axial Friction Coefficient in Hydrotest | mu_ax_hyd |
| Lateral Friction Coefficient in Operation | mu_lat_op |
| Axial Friction Coefficient in Operation | mu_ax_op |

For validation of the component design, a number of outputs are required, typically including the following: axial stress, hoop stress, Von-Mises criterion and the loads at each extremity. These outputs need to be considered for each process step in use of the component—this may involve for example the calculation of 17 outputs at each of 10 steps for a typical jumper design. Typical steps under consideration are installation steps, hydrotesting of the installed design and operation. A finite element model used to evaluate a design should integrate such steps.

A typical set of output parameters are set out in Table 3 below.

TABLE 3

Symbols of output parameters

| Parameters | Refers to | From | At Step | Units in Excel |
|---|---|---|---|---|
| Load_1_Fx_i | Load in terms of X | Extremity 1 | i | kN |
| Load_1_Fy_i | Load in terms of Y | Extremity 1 | i | kN |
| Load_1_Fz_i | Load in terms of Z | Extremity 1 | i | kN |
| Load_1_Mx_i | Moment in terms of X | Extremity 1 | i | kN · m |
| Load_1_My_i | Moment in terms of Y | Extremity 1 | i | kN · m |
| Load_1_Mz_i | Moment in terms of Z | Extremity 1 | i | kN · m |
| Load_2_Fx_i | Load in terms of X | Extremity 2 | i | kN |
| Load_2_Fy_i | Load in terms of Y | Extremity 2 | i | kN |
| Load_2_Fz_i | Load in terms of Z | Extremity 2 | i | kN |
| Load_2_Mx_i | Moment in terms of X | Extremity 2 | i | kN · m |
| Load_2_My_i | Moment in terms of Y | Extremity 2 | i | kN · m |
| Load_2_Mz_i | Moment in terms of Z | Extremity 2 | i | kN · m |
| Stress_Axial_MIN_i | Minimum of Axial stress | — | i | Mpa |
| Stress_Axial_MAX_i | Maximum of Axial stress | — | i | Mpa |
| Stress_Hoop_MIN_i | Minimum of Hoop stress | — | i | Mpa |
| Stress_Hoop_MAX_i | Maximum of Hoop stress | — | i | Mpa |
| Stress_MISES_MAX_i | Maximum of Von Mises | — | i | Mpa |

Design of Experiments and Analytic Model

As described earlier in this specification, prior art models typically assume that extreme stresses and loads will be found by considering input parameters at one of the lower bound, the baseline and the upper bound. The present inventors have appreciated that if this approach is taken, it will be possible to represent the problem with a simple and relatively tractable quadratic model. Such models can be developed using a design of experiments methodology.

If two input parameters only are considered, the equation will be of the form:

$$f(X_1,X_2)=M+a_{11}*X_1+a_{12}*X_1^2+a_{21}*X_2+a_{22}*X_2^2+b_1*X_1*X_2$$ Equation 1—Two parameter quadratic model This equation contains one interaction term between the two input parameters (a quadratic term linear in each parameter). Six coefficients need to be determined to enable this equation to be used.

More generally, the quadratic equation takes this form:

$$f(X_i)=M+\Sigma(a_{i1}*X_i+a_{i2}*X_i^2)+\Sigma b_i*X_i*X_j$$ Equation 2—General quadratic model A further assumption that has been made is that third order interactions (such as a term linearly dependent on each of three separate input parameters) will be negligible. In practice, both this assumption and the assumption that use of input parameter values at the bounds and baseline sufficiently represent system behaviour are found to be satisfactory in practice for effective design. A typical component design may require seven input parameters —this would require 36 components to be determined. In embodiments of the invention, this is achieved by use of a design of experiments methodology.

Design of experiments (DOE) is a known engineering design methodology and academic discipline (taught for example in D.C. Weber and J. H. Skillings "A First Course in the Design of Experiments: A Linear Models Approach", CRC Press, 1999 and R. H. Myers and D.C. Montgomery "Response Surface Methodology: Process and Product Optimization Using Designed Experiments", Wiley, 2002). DOE may be used to create an effective model of a problem using a limited number of experiments. For example, for a two parameter linear model where the parameters do not interact, three constants need to be determined—DOE enables an effective choice of experiments to allow these constants to be determined in a minimum number of experiments (in this case, three).

Where there is interaction between parameters, a greater number of experiments will be required, but DOE techniques have been developed to construct analytic models with interaction between variables. Three such techniques are Box-Behnken, Optimal Latin Hypercube and Orthogonal Array.

Figure 4A:
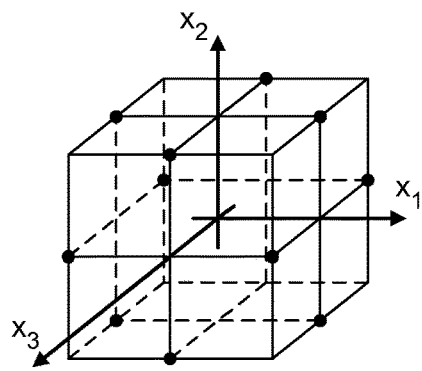
FIGS. 4A, 4B and 4C illustrate different design of experiments methodologies applicable for embodiments of the invention.

Box-Behnken This technique is illustrated in FIG. 4A. This is a 3-level factorial DOE technique—as it is 3-level it is effective to create a quadratic model, and it does not require assumptions to be made about interactions or evaluation of corner points. As a technique, it is well-defined for from 3 to 21 parameters.

Figure 4B:
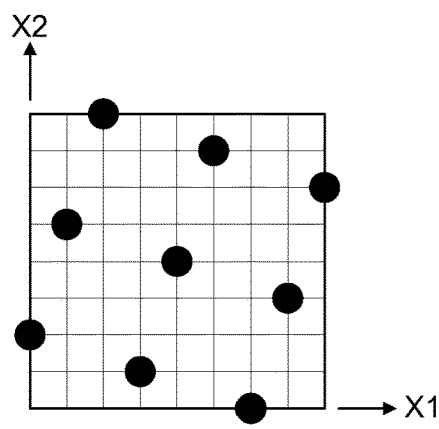

Optimal Latin Hypercube This technique is illustrated in FIG. 4B. This is a pseudo-random DOE technique with a user-defined number of points—a sufficient number of points may however be required for the influences to be well-determined (for a quadratic approximation, at least $n^2+7n+2$ points should be used for n factors). More points may be used to improve the results at the cost of additional computation time for generating the experimental matrix. This technique may be used effectively with Monte Carlo methods and may be adjusted to meet the computational resources and computation time available.

Figure 4C:
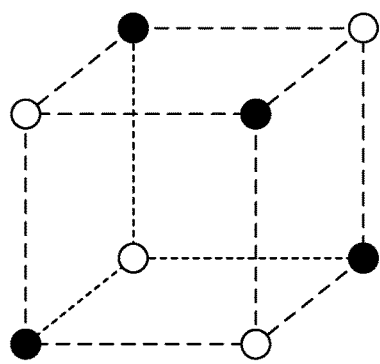

Orthogonal Array This technique (also known as Taguchi's Orthogonal Array) is illustrated in FIG. 4C. It is designed to respect independence of all input parameters and interactions and so maintain orthogonality between them. This leads to additional cost in numbers of experiments required, and may require additional assumptions to be adopted for tractability. This DOE is most effective when there are a limited number of parameters or at least some of the interactions are known.

With the use of a DOE technique, it is possible to determine which of the input parameters (such as misalignment tolerances) have the most influence on the output parameters, and to build an analytic model (this may be an analytic model for each output parameter) to represent these models. With the assumptions made that only quadratic terms at most will be relevant and that at most interactions between two input parameters need to be considered, these models will be of the form of Equation 2 above.

The DOE technique is required to determine the coefficients to use in the model. Traditional approaches would involve direct determination of extreme stresses and loads on the analytic models, but this requires excessive calculation and places too many demands on the models, particularly for a large number of output parameters. A preferred approach is to use the analytic models to determine which configurations of input parameters minimise or maximise output parameters. For the model to be effective for use, it is only necessary for the influence of input parameters to be well-determined. Finite element analyses may then be used on only the identified cases.

Identification of Cases and Finite Element Analysis

To determine a combination of input parameters that minimise or maximise an output parameter, it is necessary to minimise or maximise the analytic model of this output parameter. For seven parameters, calculation for each of the resulting 2187 parameters would be excessive, so optimizations should be considered. Typically, these will be readily available—many problems are strictly concave or convex allowing for rapid configurations in a minimum number of runs. A finite element analysis is performed to find the value of each output parameter, in a process repeated for each output.

Figure 5:
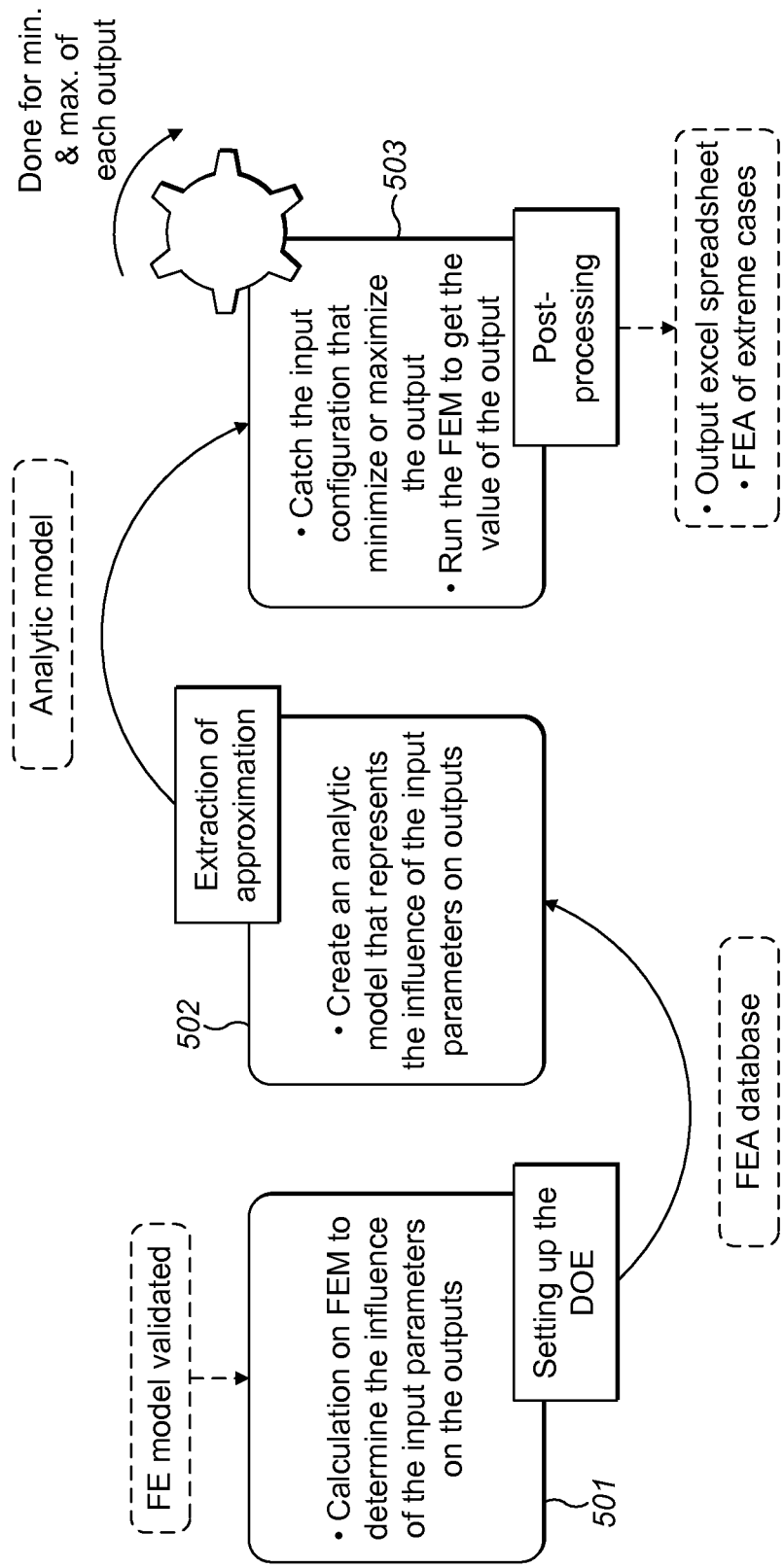
FIG. 5 illustrates schematically a specific embodiment in accordance with the approach illustrated in FIG. 2 above.

The overall calculation sequence is shown in FIG. 5. The calculation sequence refers to use of Abaqus, which is a finite element analysis tool provided as part of the SIMULIA simulation suite produced by Dassault Systemes. SIMULIA also contains Isight, a product for creating simulation process flows—Isight may be used for construction of the analytic model as set out above, and Excel may be used as a format for data input and extraction. FEM and FEA refer to Finite Element Model and Finite Element Analysis respectively.

The use of Isight to carry out each of these processes will now be considered in more detail, by way of example—it should be noted that other simulation software or custom-built models could also be used.

Step 501 involves setting up the DOE. This requires establishment of the initial input parameters for the system using Abaqus with the assistance of calculation components. Constraints may also need to be determined outside of the DOE technique in post-processing, as DOE techniques are typically not adapted to include such constraints—in order to do this, it is desirable to increase the size of the analytic model so that it can still be determined effectively when constraints are added. A DOE technique is identified and a sufficient number of DOE points are created for an effective analytic model to be constructed, the number and nature of the DOE points depending on the DOE technique used. If interactions between input parameters can be ignored (reasonable for some approximations), then linear models can be prepared using the orthogonal array approach with high efficiency. The outputs of this phase may be represented in database form (for example as a Finite Element Analysis database).

Step 502 involves using the inputs of step 501 to build a model with the necessary number of points—this built model may be termed an approximation. Response Surface Modelling (RSM)—to which the prior art literature mentioned above relates—is a known technique for this purpose. RSM may be used to create linear, quadratic or even cubic and quartic analytic models. At least a quadratic analytic model is needed to consider interactions, and a 4 level DOE is needed for a cubic model and a 5 level DOE for a quartic model. As indicated previously, quadratic analytic models have been used in embodiments described here.

Figure 9:
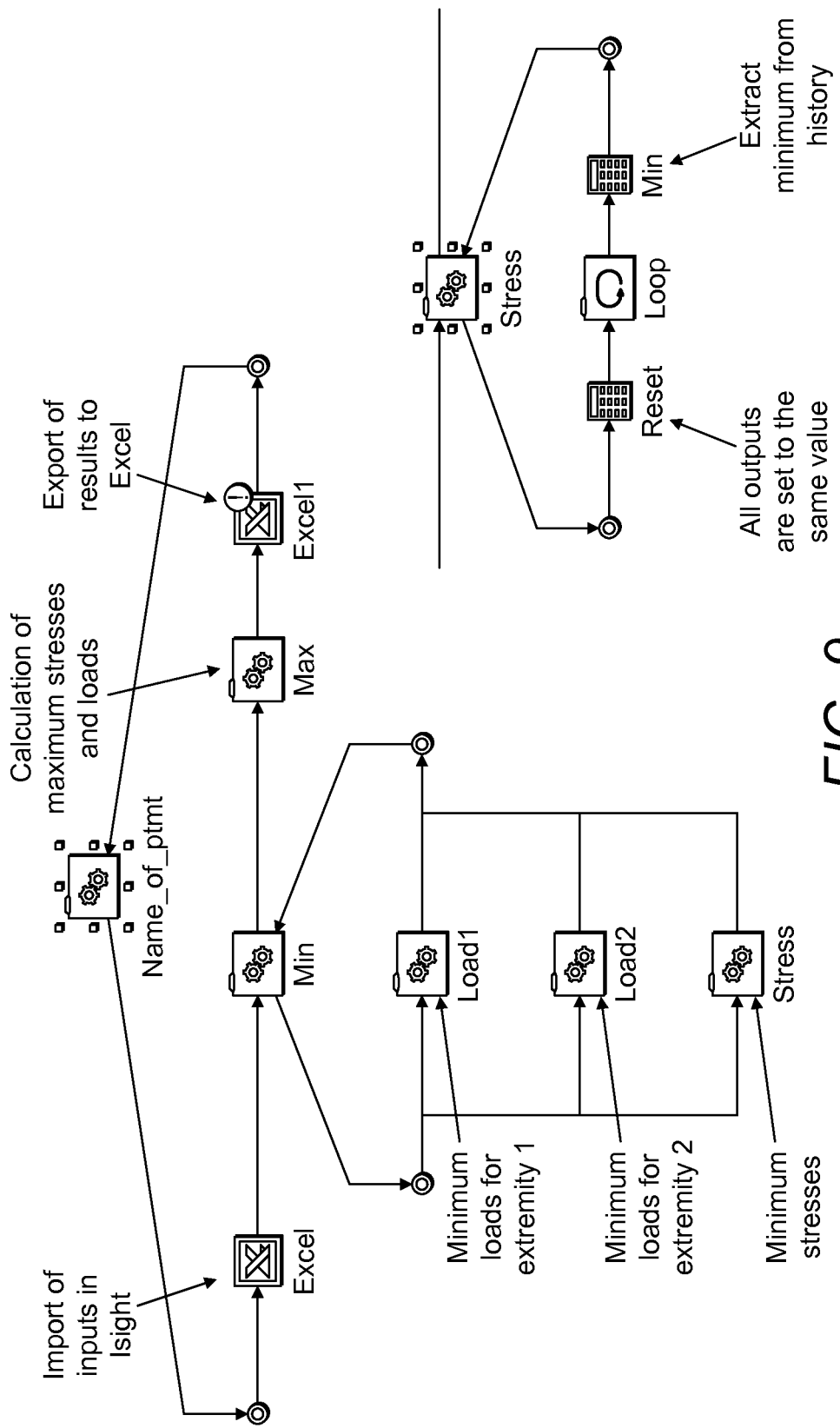
FIG. 9 shows a global workflow for post-processing to use the derived analytic model to obtain results.

Step 503 shows the post-processing to catch and use input parameter data sets that produce minima or maxima for the analytic model. The inputs for this step are the analytic model developed in step 502 and data provided as an Excel file, with an output again provided as Excel. The Excel input file may for example contain bounds and baseline for input parameters and the outputs that require determination by step and by type. Computational processes needed in the arrangement of this embodiment are as follows:

Approximation component to run analytic model
Abaqus to perform FEA and determine output values
Calculator for mathematical operations (such as ensuring rotational constraints are properly met)
Extraction of extreme values
Loop iteration
Optimisation to identify effective configurations FIG. 9 illustrates a typical general workflow for this post-processing step 503. Data is brought in through an Excel file, and a minimisation process is carried out followed by a maximisation process, with the results exported to an Excel file. The minimisation process is shown in further detail. Minimum loads for each extremity of the component are determined, together with minimum component stresses—these minima may be determined in parallel.

Each task (as shown here for minimum stress) follows the same sequence. All outputs are set to common values before carrying out the loop and FEA steps. A computational loop is then executed to find the input configuration that minimise or maximise the output as required. The FEA is then performed for this configuration. The loop history is then assessed to identify the parameter values needed. The loop may be carried out on a matrix of input Excel spreadsheet data (with an appropriate macro), with each array corresponding to a run and being composed of the weights of the resulting outputs.

Figure 10:
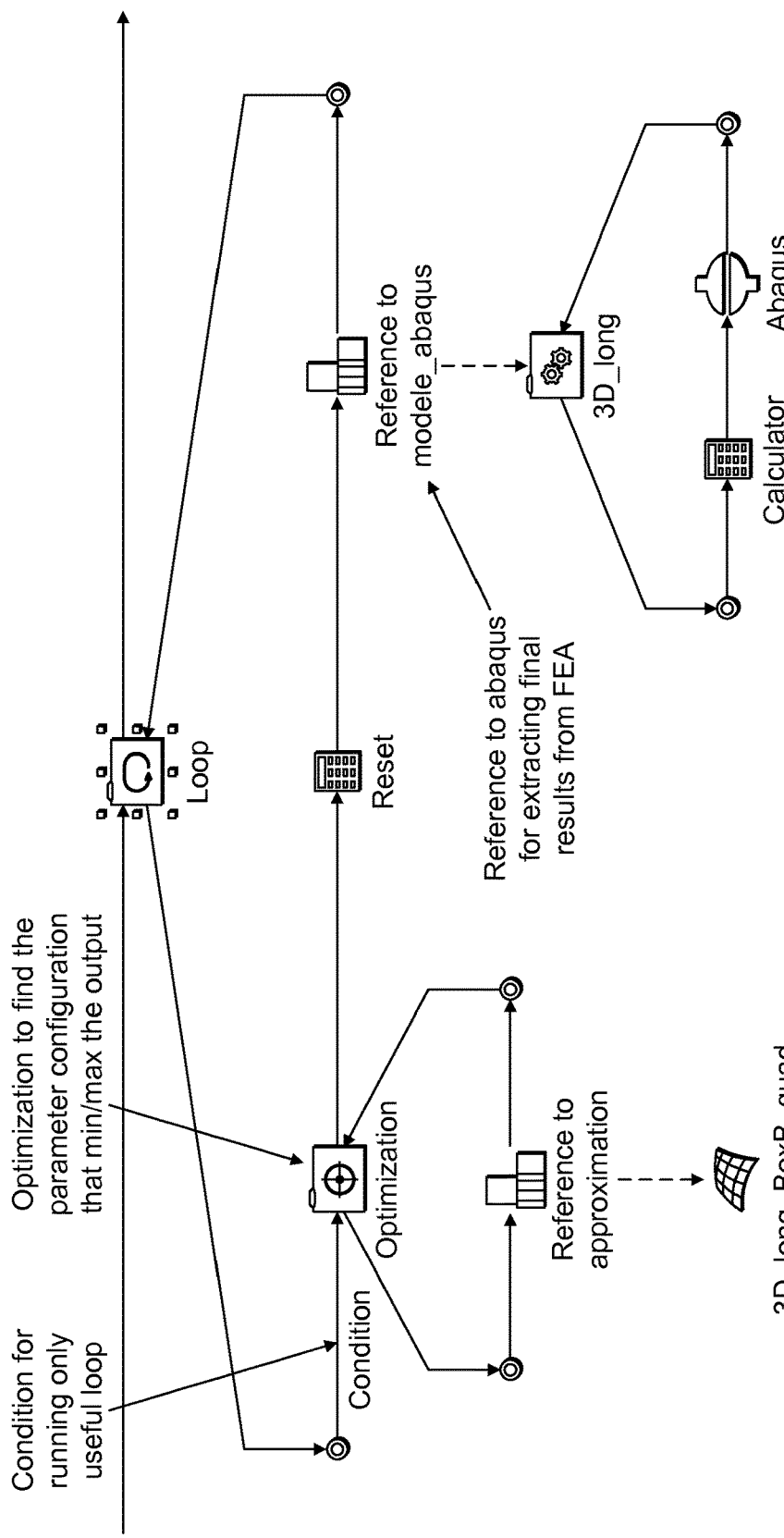
FIG. 10 shows a workflow for a single post-processing loop of FIG. 9.

FIG. 10 shows a loop workflow according to such a process. An optimisation algorithm is used to find the configuration of input parameters that maximise or minimise the output. Many optimisation techniques are available (and many are implemented in (sight), but an appropriate choice needs to be made appropriate to the functions involved. Using a linear or quadratic model, the function will be strictly concave or convex—in such cases, a hill-climbing technique such as the BFGS (Broydon-Fletcher-Goldfarb-Shanno) algorithm will be effective. This is implemented in Isight as the NLPQL (Non-Linear Programming by Quadratic Lagrangian) technique. These and other processes are discussed in more detail in the literature of numerical optimization.

The process of design of a pipeline component according to embodiments of the invention may thus be carried out with suitably programmed computing apparatus. As indicated above, computing apparatus configured to operate the SIMULIA simulation suite, with ancillary software such as Excel, may be suitably programmed in accordance with embodiments of the invention to provide a pipeline component design as its output. Embodiments of the invention may be provided in the form of a data structure adapted to program a suitable computer to carry out a method as indicated above, for example by a program using the components of the SIMULIA simulation suite and Excel as indicated above.

The output of the pipeline component design process is thus a pipeline component design providing appropriate dimensions for a tie-in such as a jumper or a spoolpiece. The jumper or spoolpiece may then be fabricated using conventional processes according to this design for subsequent deployment in a pipeline.

Examples of the application of the approach described above will now be considered and compared to traditional approaches. In each case, a tie-in will be assembled from beam elements with linear interpolation, with the models comprising 300 to 400 elements.

Vertical 2D M-shaped Jumper

Figure 6A:
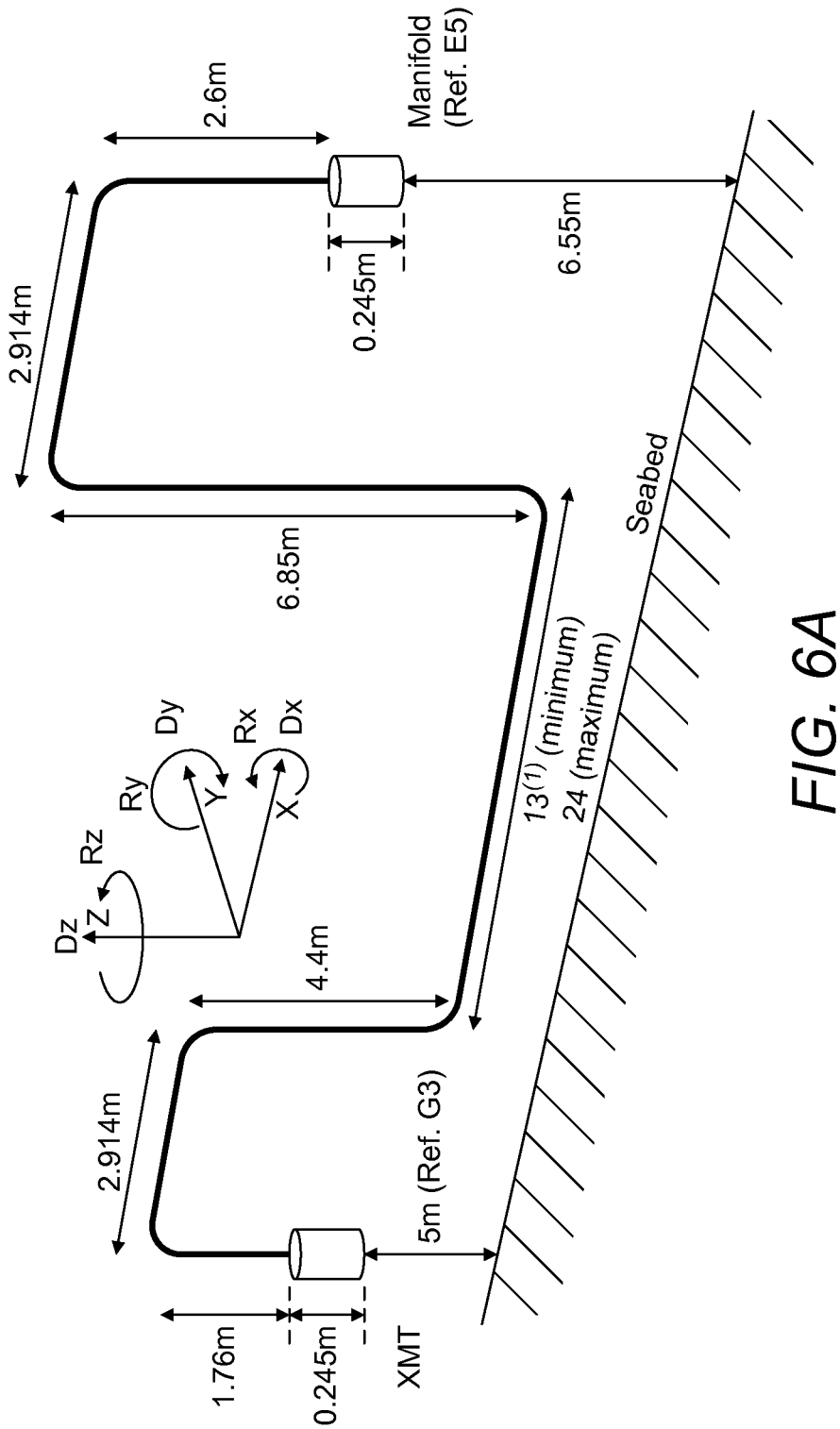

FIG. 6A shows an exemplary M-shaped jumper with data taken from an existing production pipeline. The jumper connects a Christmas tree (XMT) of a wellhead with a manifold on a connecting pipeline component. Both the XMT and manifold are anchored structures, so there is no expansion and no soil contact.

The following misalignment tolerances were used, with fabrication, metrology and installation tolerances all incorporated in a single misalignment tolerance.

TABLE 4

Misalignment tolerances for 2D jumper

| Extremity | XMT | Manifold |
|---|---|---|
| Linear Tolerance in terms of X (mm) | DXtol1 = +/−0.11 | NA |
| Linear Tolerance in terms of Y (mm) | DYtol1 = +/−0.11 | NA |
| Linear Tolerance in terms of Z (mm) | DZtol1 = +/−0.1 | NA |
| Angular Tolerance in terms of X (°) | RXtol1 = +/−2.5 | RXtol2 = +/−3 |
| Angular Tolerance in terms of Y (°) | RYtol1 = +/−2.5 | RXtol2 = +/−3 |

This approach uses seven input parameter tolerances (three translations at one extremity, two rotations at each extremity). For a full factorial DOE at three levels, this would involve $3^7$ combinations (2187 runs in total), but the addition of a rotational constraint eliminates a number of these combinations. For angular tolerances on diagonals, three levels are taken for linear tolerances and two levels for angular tolerances on corners—this totals 432 runs. For angular tolerances on axes, three levels are again needed for linear tolerances but now with five combinations of angular tolerances on each extremity, with two points on each axis and the baseline this leads to 675 runs. The overall calculation sequence is shown in FIG. 6B.

This approach was assessed using all of the DOE techniques described above: Optimal Latin Hypercube (here with 100 points, and termed OLH 100), Box-Behnken (using 57 points, termed BoxB), a linear array with 81 points (termed L81) and a linear model without interactions (termed L8). These are found to give very similar results, except that the simplest L8 model breaks down for one output parameter while performing well for the others. The main difference between these methods and a conventional calculation across all parameters (termed Batch) is in computational time, as is shown in Table 5 below:

TABLE 5

Comparison of calculation times for 2D Jumper

| | Time Analysis | |
|---|---|---|
| Method | Number of FEA | Time |
| Batch | 1167 | 220 min |
| OLH 100 | DOE: 100 Post Processing: 135 | 60 min |
| BoxB | DOE: 57 Post Processing: 135 | 50 min |
| L81 | DOE: 81 Post Processing: 135 | 55 min |
| L8 | DOE: 8 Post Processing: 135 | 37 min |

As can be seen, all the DOE techniques used provide a very significant time saving on the conventional approach. A DOE approach (Box-Behnken) was also used to check the assumption that the linear displacements could be applied on a single extremity—this was found to be justified.

Figure 7A:
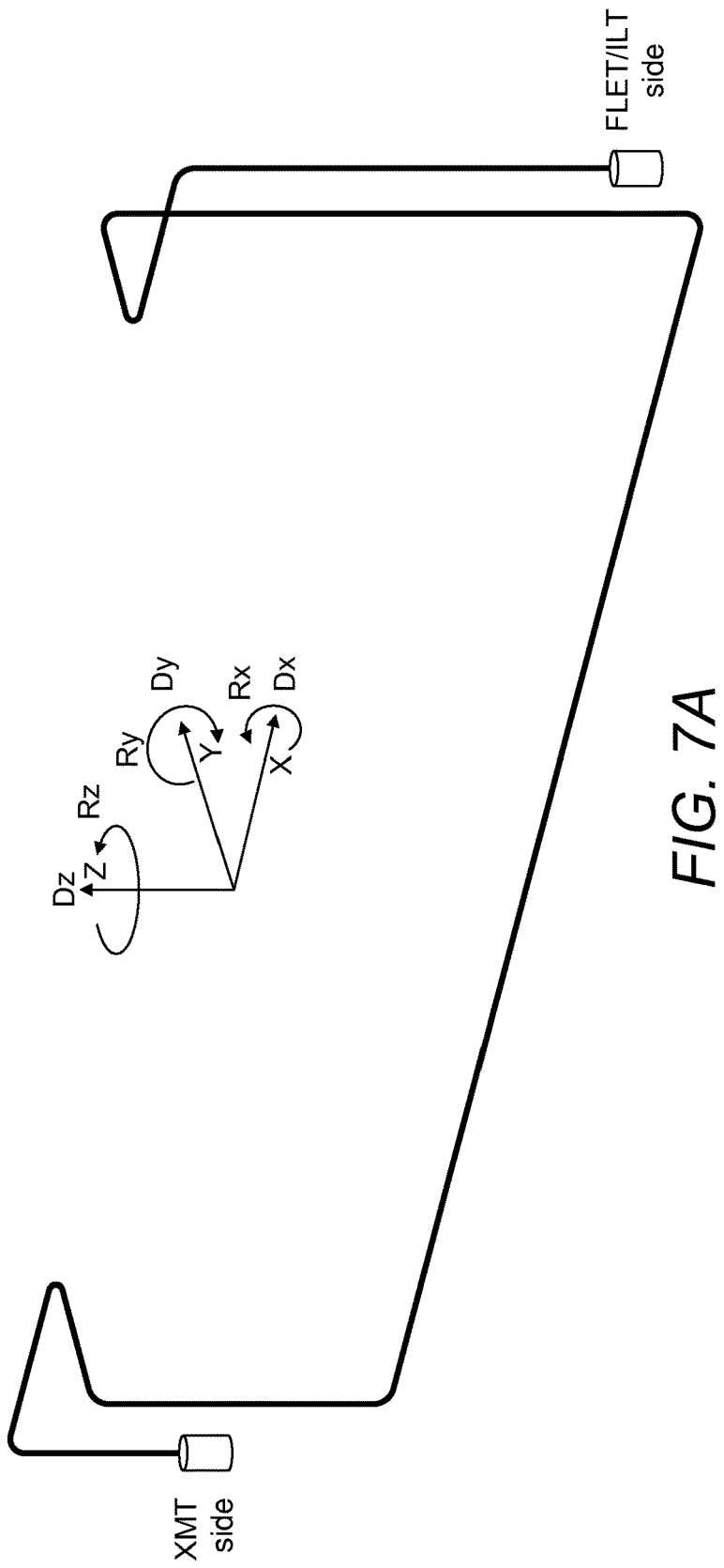
FIG. 7A illustrates an exemplary 3-D jumper design and FIG. 7B illustrates a calculation sequence for use with such a 3-D jumper design.

Vertical 3D M-shaped Jumper FIG. 7A shows an exemplary 3-D M-shaped jumper with data taken from an existing production pipeline. The jumper connects a Christmas tree (XMT) of a wellhead with an in-line tee (ILT). The ILT may not be connected to the jumper as an anchored structure, so may move during hydrotest and operation. Expansion therefore needs to be considered—this may be calculated downstream and imposed as a displacement on the jumper extremity. There is again no soil contact to consider.

Figure 7B:
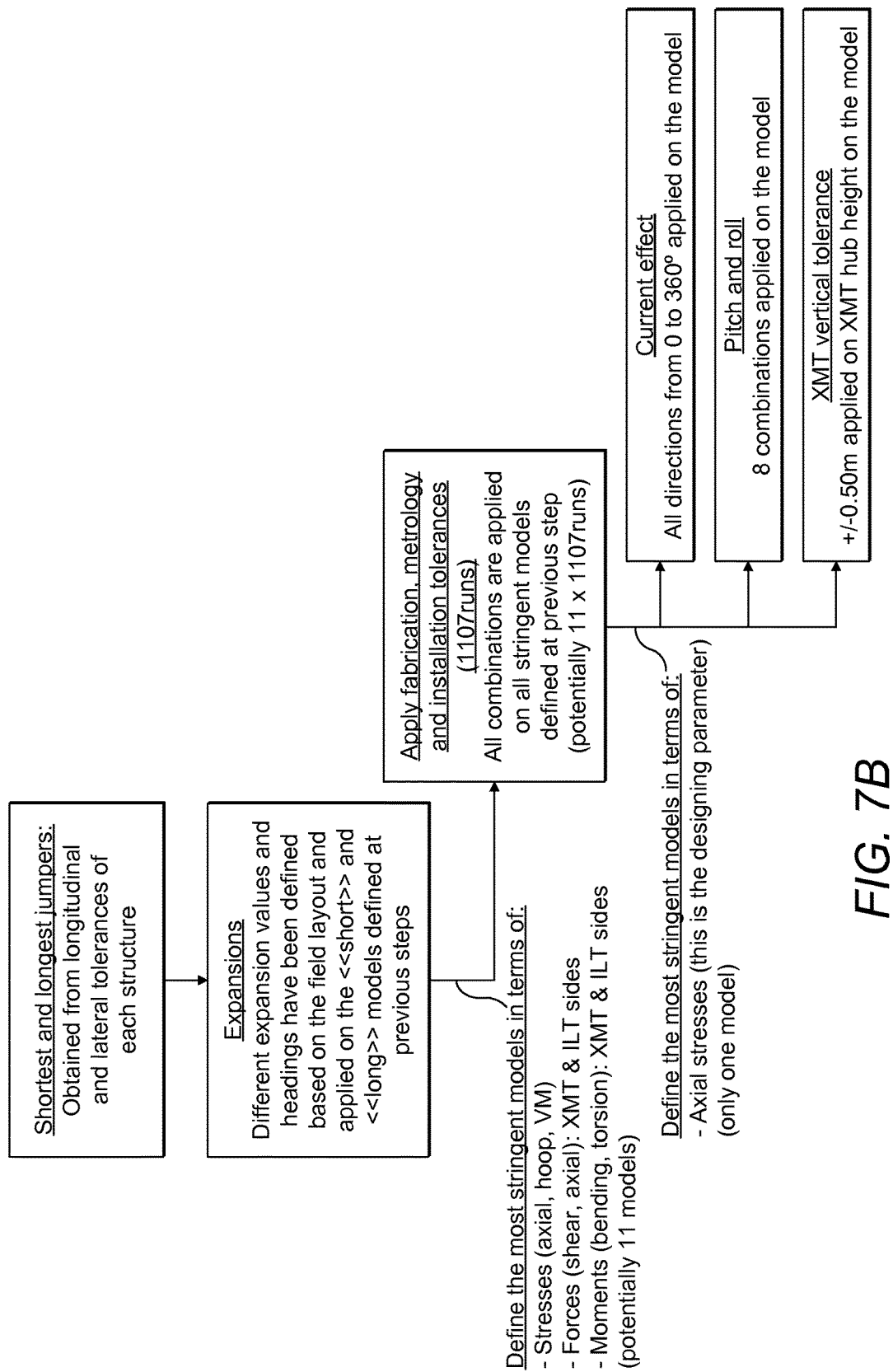

The calculation sequence is shown in FIG. 7B—this is similar to that of FIG. 6B, but additional complexity is added by the expansion considerations.

The following misalignment tolerances were used, with fabrication, metrology and installation tolerances all incorporated in a single misalignment tolerance as before.

TABLE 6

Misalignment tolerances for 3D jumper

| Extremity | XMT | ILT |
|---|---|---|
| Linear Tolerance in terms of X (mm) | DXtol1 = +/−0.11 | NA |
| Linear Tolerance in terms of Y (mm) | DYtol1 = +/−0.11 | NA |
| Linear Tolerance in terms of Z (mm) | DZtol1 = +/−0.1 | NA |
| Angular Tolerance in terms of X (°) | RXtol1 = +/−2.5 | RXtol2 = +/−1 |
| Angular Tolerance in terms of Y (°) | RYtol1 = +/−2.5 | RXtol2 = +/−1 |

As for the 2D jumper, the number of cases may be reduced on consideration of the rotational constraint.

This approach was assessed using all of the DOE techniques described with reference to the 2D jumper. These are again found to give very similar results, except for the L8 model, which generally provides high values. The main difference between the other DOE methods and the conventional calculation is again in computational time, as is shown in Table 7 below:

TABLE 7

Comparison of calculation times for 2D Jumper

| | Time Analysis | |
|---|---|---|
| Method | Number of FEA | Time |
| Batch | 1167 | 220 min |
| OLH 100 | DOE: 100 Post Processing: 135 | 60 min |
| BoxB | DOE: 57 Post Processing: 135 | 50 min |
| L81 | DOE: 81 Post Processing: 135 | 55 min |
| L8 | DOE: 8 Post Processing: 135 | 37 min |

There is thus essentially no difference in performance between the 2D jumper and the 3D jumper cases.

Spoolpiece

Figure 8A:
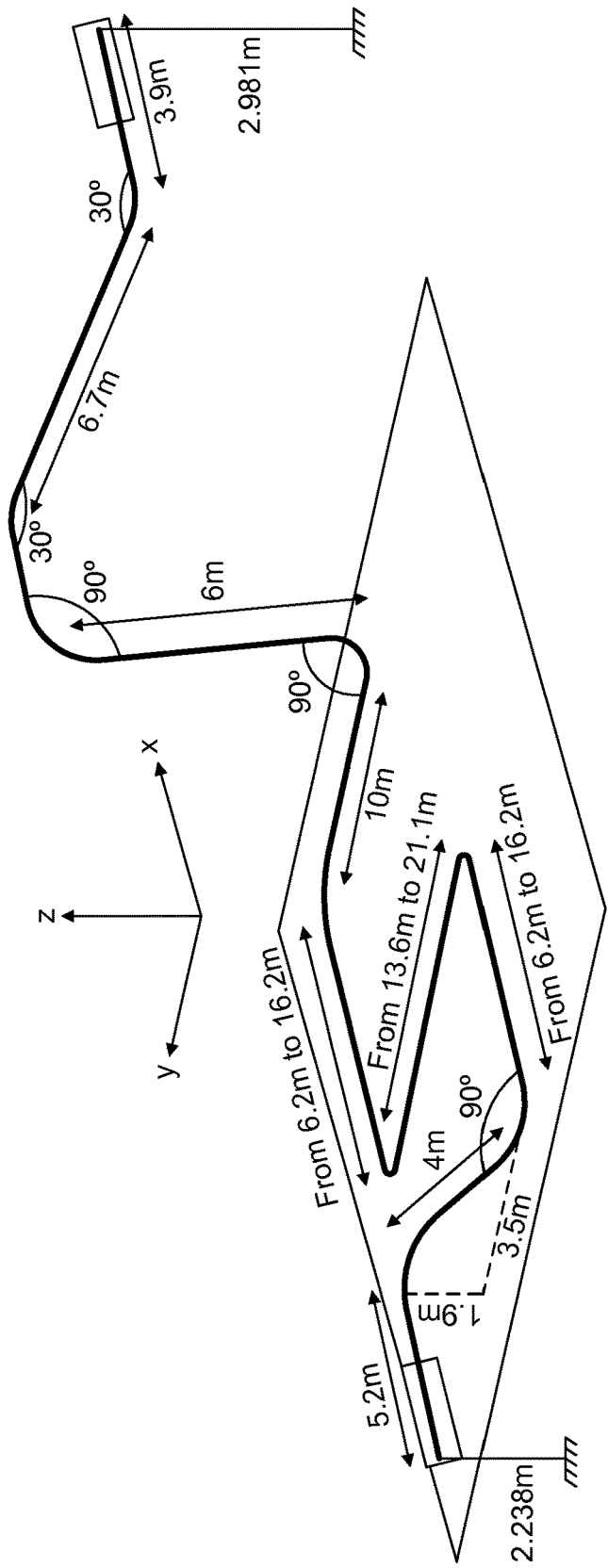
FIG. 8A illustrates an exemplary spoolpiece design and FIG. 8B illustrates a calculation sequence for use with such a spoolpiece design.

FIG. 8A shows an exemplary spoolpiece (hereafter "spool") with data taken from an existing production pipeline. The main difference from the jumper examples discussed previously is in the soil contact and the need to use appropriate additional input parameters The following additional input parameters were used to represent the soil conditions of the spool.

TABLE 8

Soil conditions for the spool

| Soil Conditions | Lower Bound | Upper Bound |
|---|---|---|
| Soil Stiffness (N/m/m) | 30000 | 70400 |
| Lateral Friction Coefficient in Hydrotest | 0.12 | 1.27 |

TABLE 8-continued

Soil conditions for the spool

| Soil Conditions | Lower Bound | Upper Bound |
|---|---|---|
| Axial Friction Coefficient in Hydrotest | 0.10 | 0.47 |
| Lateral Friction Coefficient in Operation | 0.14 | 1.49 |
| Axial Friction Coefficient in Operation | 0.18 | 0.80 |

The misalignment tolerances of the spool were similar to those for the jumpers, but applied to each extremity.

TABLE 9

Misalignment tolerances for spool

| Extremity | First extremity | Second extremity |
|---|---|---|
| Linear Tolerance in terms of X (mm) | +/−0.05 | +/−0.05 |
| Linear Tolerance in terms of Y (mm) | +/−0.05 | +/−0.05 |
| Linear Tolerance in terms of Z (mm) | +/−0.05 | +/−0.05 |
| Angular Tolerance in terms of X (°) | +/−1 | +/−1 |
| Angular Tolerance in terms of Y (°) | +/−1 | +/−1 |

Figure 8B:
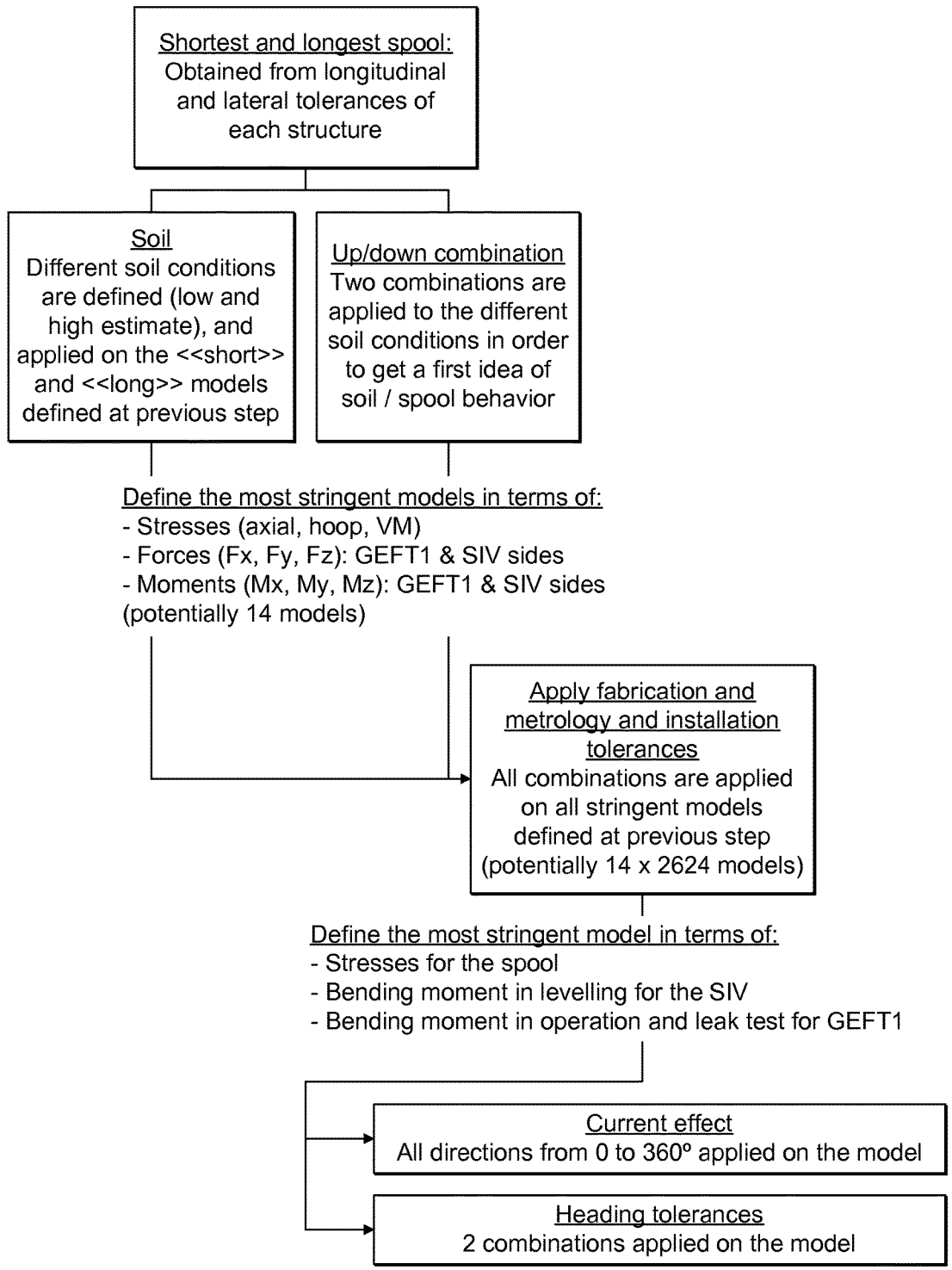

The calculation sequence is shown in FIG. 8B. Linear tolerances were applied on each extremity, leading to $3^{10}$ combinations (59049 runs in total), which is too great a number to perform in practice. The rotational constraint was applied as before, and it was also assumed that extreme stresses or loads would be on the upper bound or the lower bound of the linear tolerances. This reduced the number of runs needed to a more tractable 2624 runs.

This approach was assessed using all of the DOE techniques described above and compared with a conventional approach, in which the full number of combinations of misalignment tolerances are applied to a variety of soil conditions, whereas in the present approach all the input parameters may be considered together. More data points are needed because of the greater complexity of this system: Optimal Latin Hypercube uses 332 points (OLH 332), Box-Behnken uses 421, and a linear model without interactions uses 16 (termed L16). These are found to give broadly similar results, with L16 giving the most conservative approach—OLH outperforms Box-Behnken on time.

TABLE 10

Comparison of calculation times for spool

| | Time Analysis | |
|---|---|---|
| Method | Number of FEA | Time |
| Batch | 2624 | 29 h 30 min |
| BoxB | DOE: 421 Post Processing: 189 | 7 h |
| OLH 332 | DOE: 332 Post Processing: 189 | 6 h |
| L16 | DOE: 16 Post Processing: 189 | 2 h 20 min |

Again, there is a very considerable time saving in this approach.

As is shown above, embodiments of the invention may be used to produce designs for pipeline components, and in particular tie-ins such as jumpers and spoolpieces. The skilled person will appreciate that the approach set out here has broader application, for example to other aspects of pipeline design. Modifications and improvements may be made to the foregoing without departing from the scope of the invention.

The invention claimed is:

1. A method of manufacturing a tie-in component for an underwater pipeline system, the method comprising:

identifying a plurality of input parameters and output parameters for the tie-in component design the input parameters comprising position and orientation of endpoints, misalignment tolerances, loads, and soil properties, the output parameters comprising number and length of pipes with angles therebetween;

using a design of experiments technique to construct analytic models representing the influences of the input parameters on the output parameters;

applying the analytical models to a plurality of sets of input parameters, each set of input parameters corresponding to a possible tie-in component design, to produce a plurality of output parameters;

selecting a limited number of the possible tie-in component designs for finite element analysis by identifying a plurality of selected value sets for the input parameters, each selected value set meeting one of one or more selection criteria for at least one of the output parameters, the selection criteria comprising minimizing or maximizing at least one of the output parameters;

conducting finite element analysis on each of the plurality of identified value sets, and identifying a tie-in component design choice from results of the finite element analysis; and manufacturing the tie-in component for the underwater pipeline system according to the identified component design choice in accordance with the input parameters with the tie-in component comprising a number and length of pipes with angles therebetween in accordance with the output parameters.

2. The method as claimed in claim 1, wherein the tie-in component is a jumper.

3. The method as claimed in claim 1, wherein the tie-in component is a spoolpiece.

4. The method as claimed in claim 1, wherein the input parameters comprise one or more translational tolerances and one or more rotational tolerances.

5. The method as claimed in claim 1, wherein the analytic model comprises at least one quadratic model.

6. The method as claimed in claim 5, wherein the analytic model comprises a quadratic model for each output parameter.

7. The method as claimed in claim 6, wherein the analytic model comprises only terms which are at least one of constant, first order terms, second order terms, and interaction terms.

8. The method as claimed in claim 7 wherein the design of experiments technique comprises a Box-Behnken technique, an Optimal Latin Hypercube technique or an orthogonal array technique.

9. The method as claimed in claim 8, wherein identifying value sets for the input parameters which minimize or maximize at least one of the output parameters comprises iterating an optimization loop for each output parameter which minimizes or maximizes that output parameter.

10. The method as claimed in claim 9, wherein the optimization loop uses a differentiable optimization technique.

* * * * *